(12) United States Patent
Seo

(10) Patent No.: US 6,893,977 B2
(45) Date of Patent: May 17, 2005

(54) METHOD OF MANUFACTURING A SEMICONDUCTOR DEVICE

(75) Inventor: Young-Hun Seo, Bucheon (KR)

(73) Assignee: ANAM Semiconductor Inc., Seoul (KR)

( * ) Notice: Subject to any disclaimer, the term of this patent is extended or adjusted under 35 U.S.C. 154(b) by 0 days.

(21) Appl. No.: 10/744,718

(22) Filed: Dec. 23, 2003

(65) Prior Publication Data

US 2004/0137737 A1 Jul. 15, 2004

(30) Foreign Application Priority Data

Dec. 24, 2002 (KR) .................................. 10-2002-0083422

(51) Int. Cl.⁷ ...................... H01L 21/302; H01L 21/461
(52) U.S. Cl. ........................ 438/738; 438/778; 438/959
(58) Field of Search .................................. 438/738, 739, 438/740, 744, 751, 764, 778, 959

(56) References Cited

U.S. PATENT DOCUMENTS

| 5,869,374 A | * | 2/1999 | Wu ............................ 438/291 |
| 5,880,004 A | * | 3/1999 | Ho ............................. 438/421 |
| 6,063,699 A |   | 5/2000 | Hanafi et al. ............... 438/589 |
| 6,548,388 B2 |  | 4/2003 | Hwang et al. .............. 438/587 |

* cited by examiner

Primary Examiner—Phuc T. Dang
(74) Attorney, Agent, or Firm—Hanley, Flight & Zimmerman, LLC

(57) ABSTRACT

A method of fabricating a semiconductor device is disclosed. An example method sequentially forms a gate insulation film and a sacrificial film on a semiconductor substrate. In addition, the example method forms a bowing hollow by selectively etching the sacrificial layer, forms gate material on the gate insulation film exposed through the bowing hollow and the sacrificial film, and forms a gate by anisotropically etching the gate material such that the gate material remains on an inner side wall of the bowing hollow.

20 Claims, 2 Drawing Sheets

METHOD OF MANUFACTURING A SEMICONDUCTOR DEVICE

FIELD OF THE DISCLOSURE

The present disclosure relates generally to semiconductor devices and, more particularly, to a method of forming a gate having a narrow width within a highly integrated semiconductor device.

BACKGROUND

In general, a MOS transistor, which is a type of field effect transistor, has a structure where source and drain regions are formed on a semiconductor substrate and a gate oxide film and a gate are formed on the semiconductor substrate on which the source and drain regions are formed.

Known example methods for forming a gate in a MOS transistor are disclosed in U.S. Pat. Nos. 6,548,388 and 6,063,699. In conventional methods for fabricating the MOS transistor, after a gate oxide film is formed in a device active region of a semiconductor substrate and a polycrystalline silicon layer is formed on the gate oxide film, a photosensitive film is applied, exposed and developed on the polycrystalline silicon layer to form a pattern of photosensitive film for covering the polycrystalline silicon layer only by a desired width and exposing the remaining polycrystalline silicon layer.

Next, using, for example, an EPD (end point detection) apparatus, the exposed polycrystalline silicon layer is etched using the pattern of photosensitive film as a mask, leaving the polycrystalline silicon layer of the desired width to be formed as a gate. However, because light is reflected from the polycrystalline silicon layer and so on below the photosensitive film when the photosensitive film is exposed and developed, it is difficult to precisely pattern the photosensitive film to a desired pattern dimension. This may cause a critical problem because a pattern dimension of the photosensitive film decreases as a device becomes more highly integrated.

To overcome the problem of fabricating a gate having a narrow width within a highly integrated device, an organic or inorganic anti-reflection coating is typically formed on the polycrystalline silicon layer.

However, even if such an anti-reflection coating is formed, there is a practical lower limit to a pattern dimension of the photosensitive film. With known photolithography processes, a gate of 0.18 $\mu$m width can be realized, but it is not currently possible to realize a gate of widths reduced to 0.15 $\mu$m, 0.13 $\mu$m, etc.

DETAILED DESCRIPTION

As described in greater detail below, an example method of fabricating a semiconductor device include the steps of sequentially forming a gate insulation film and a sacrificial film on a semiconductor substrate, forming a bowing hollow by selectively etching the sacrificial layer, forming gate material on the gate insulation film exposed through the bowing hollow and the sacrificial film, and forming a gate by anisotropically etching the gate material such that the gate material remains on an inner side wall of the bowing hollow.

Preferably, in the anisotropic etching, an etching in a vertical direction is faster than that in a horizontal direction, and the anisotropic etching is one of an etch back method and a chemical mechanical polishing method.

Preferably, when forming the gate, the gate material is anisotropically etched to have a width corresponding to a width of an objective gate, or is over-etched until the gate material has a width corresponding to a width of an objective gate.

Preferably, the gate material is polycrystalline silicon.

Preferably, in the anisotropic etching, top surfaces of the gate insulation film and the sacrificial film on the bottom of the bowing hollow are exposed.

Preferably, when forming the bowing hollow, the sacrificial film is selectively etched so that the bowing hollow has a width corresponding to a width of an objective gate plus a width of an adjacent gate plus a distance between the objective gate and the adjacent gate.

Preferably, the sacrificial film is selectively etched using one of a method using an EPD (end point detection) apparatus and a method of etching the sacrificial film during fixed time.

Preferably, when forming the bowing hollow, an extent of bowing is proportional to the width of the objective gate.

Preferably, when forming the gate, two gates are simultaneously formed by leaving the gate material on both inner side walls of the bowing hollow.

Preferably, the sacrificial film is a nitride film and, preferably, a thickness of the sacrificial film is proportional to a width of an objective gate.

Preferably, a surface of the gate is a curved surface.

Preferably, the method further comprises, after the step of forming the gate, a step of removing the sacrificial film.

Preferably, the sacrificial film is removed by a wet etching.

Preferably, the gate insulation film is an oxide film.

Figure 1A:
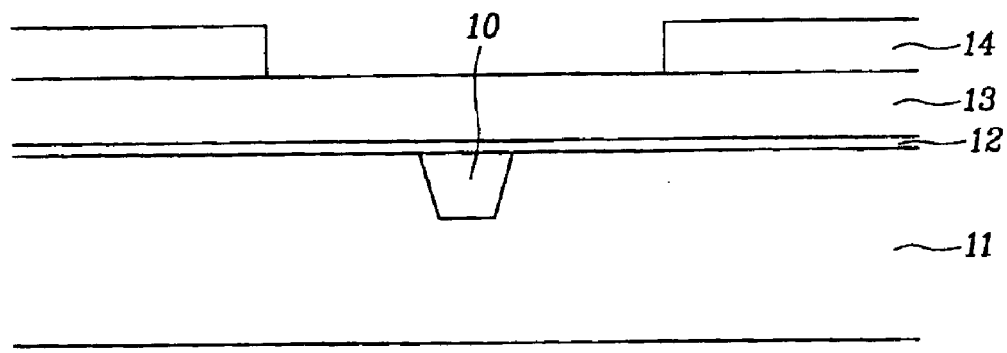
FIGS. 1a to 1d are sectional views depicting an example method of fabricating an example semiconductor device.

FIGS. 1a to 1d are sectional views showing an example method of fabricating an example semiconductor device. First, as shown in FIG. 1a, a gate oxide film 12 is formed on a semiconductor substrate 11 where an active region is separated from an isolation region by a trench 10, and then a nitride film 13 is formed as a sacrificial film on the gate oxide film 12.

The nitride film 13 formed as the sacrificial film is a film formed to provide a bowing hollow where a gate will be formed later, and a thickness of the nitride film 13 is determined in based on a width of an objective gate. The thickness of the nitride film 13 is proportional to the width of the objective gate.

Subsequently, a photosensitive film is applied, exposed and developed on the nitride film 13 to form a pattern of photosensitive film 14 for exposing the nitride film 13 of a predetermined width.

At this time, when a width of the exposed nitride film 13 is set to correspond to the width of the objective gate plus a width of an adjacent gate plus a distance between the objective gate and the adjacent gate, these two gates can be simultaneously formed.

Figure 1B:
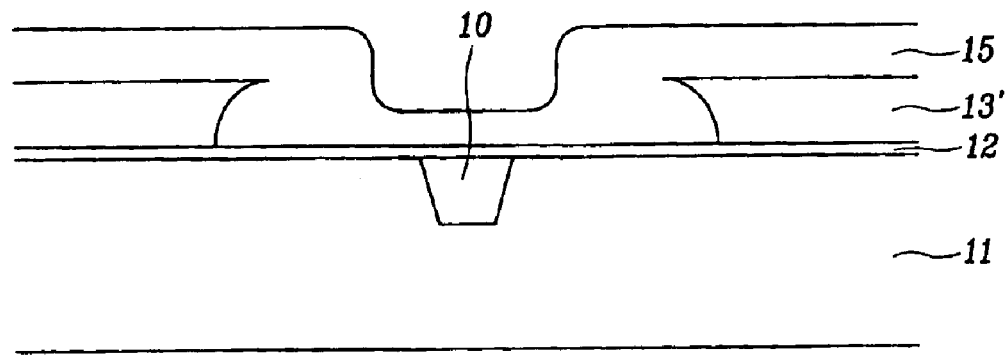

Next, as shown in FIG. 1b, the exposed nitride 13 is etched using the pattern of photosensitive film 14 as a mask to form a pattern of nitride film 13'. At this time, the nitride film 13 is etched to be bowed such that the pattern of nitride film 13' has a bowing hollow 20.

Subsequently, after the pattern of photosensitive film is removed and then a cleaning process is performed, gate material 15 is formed on an entire surface of the semiconductor substrate 11 including the pattern of nitride film 13' and the gate oxide film 12. A polycrystalline silicon can be employed as the gate material 15.

Figure 1C:
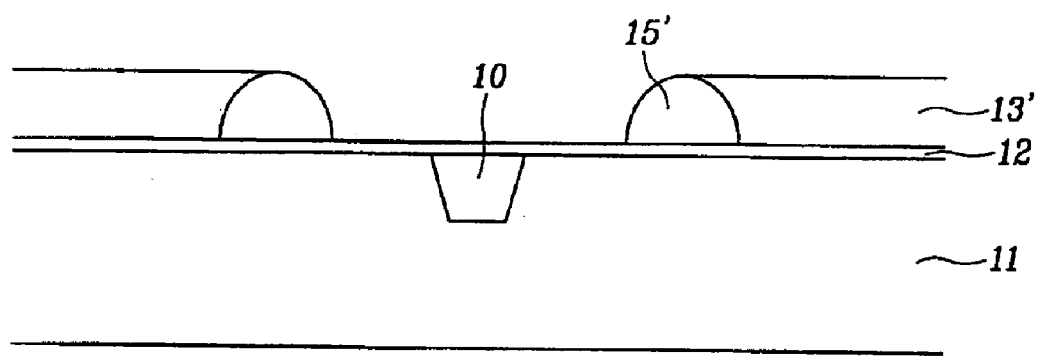

Next, as shown in FIG. 1c, a gate 15' formed of the polycrystalline silicon layer having a curved surface is formed by leaving the polycrystalline silicon layer 15 on an inner wall of the bowing hollow 20 by an etch back.

At this time, the polycrystalline silicon layer is etched back such that it has a width corresponding to the width of the objective gate. As one example, the polycrystalline silicon layer can be over-etched until it has a width corresponding to the width of the objective gate.

An extent of over-etching is determined based on a width dimension of the objective gate. Specifically, the narrower the width of the objective gate is, the narrower a width of the gate 15' remains by over-etching the polycrystalline silicon layer more.

Herein, the etch back is not used in an exclusive sense for the gate material. Alternatively, it is possible to use an anisotropic etching where an etching in a vertical direction is faster than that in a horizontal direction, and a chemical mechanical polishing can be used for the anisotropic etching.

Figure 1D:
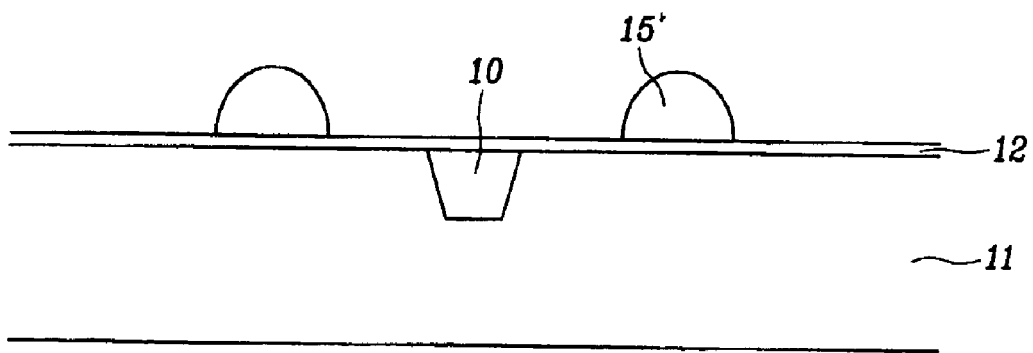

Finally, as shown in FIG. 1d, the pattern of nitride film 13' is removed and then typical processes for fabricating a transistor are performed. The pattern of nitride film 13' is preferable to be removed by the wet etching.

As apparent from the above description, because a gate having a width corresponding to a width of an objective gate is formed by an etch back method, the example method described herein may be used to form a gate of a narrow width, which could not be realized using known techniques. In addition, two gates can be simultaneously formed by a single etch back process.

Although certain methods and apparatus have been described herein, the scope of coverage of this patent is not limited thereto. To the contrary, this patent covers all embodiments fairly falling within the scope of the appended claims either literally or under the doctrine of equivalents.

What is claimed is:

1. A method of fabricating a semiconductor device, the method comprising:
   sequentially forming a gate insulation film and a sacrificial film on a semiconductor substrate;
   forming a bowing hollow by selectively etching the sacrificial layer;
   forming gate material on the gate insulation film exposed through the bowing hollow and the sacrificial film; and
   forming a gate by anisotropically etching the gate material such that the gate material remains on an inner side wall of the bowing hollow.

2. The method of claim 1, wherein in the anisotropic etching, an etching in a vertical direction is faster than that in a horizontal direction.

3. The method of claim 1, wherein the anisotropic etching is one of an etch back method and a chemical mechanical polishing method.

4. The method of claim 1, wherein, in forming the gate, the gate material is anisotropically etched to have a width corresponding to a width of an objective gate.

5. The method of claim 1, wherein, in the anisotropic etching, the gate material is over-etched until the gate material has a width corresponding to a width of an objective gate.

6. The method of claim 5, wherein the gate material is polycrystalline silicon.

7. The method of claim 1, wherein, in the anisotropic etching, the gate insulation film on the bottom of the bowing hollow and top surfaces of the sacrificial film are exposed.

8. The method of claim 1, wherein the step of forming the bowing hollow includes forming the bowing hollow by selectively etching the sacrificial film such that the blowing hollow has a width corresponding to a width of an objective gate plus a width of an adjacent gate plus a distance between the objective gate and the adjacent gate.

9. The method of claim 1, wherein the sacrificial film is selectively etched using one of and end point detection apparatus and a method of etching for a fixed time.

10. The method of claim 9, wherein the sacrificial film is a nitride film.

11. The method of claim 1, wherein, in forming the bowing hollow, an extent of bowing is proportional to a width of an objective gate.

12. The method of claim 1, wherein, in forming the gate, two gates are simultaneously formed by leaving the gate material on both inner side walls of the bowing hollow.

13. The method of claim 1, wherein the sacrificial film is a nitride film.

14. The method of claim 1, wherein the gate material is polycrystalline silicon.

15. The method of claim 1, wherein a thickness of the sacrificial film is proportional to a width of an objective gate.

16. The method of claim 1, wherein a surface of the gate is a curved surface.

17. The method of claim 1, further comprising, after the step of forming the gate, a step of removing the sacrificial film.

18. The method of claim 17, wherein the sacrificial film is removed by a wet etching.

19. The method of claim 18, wherein the sacrificial film is a nitride film.

20. The method of claim 1, wherein the gate insulation film is an oxide film.

* * * * *